(12) United States Patent
Lee et al.

(10) Patent No.: US 9,099,313 B2
(45) Date of Patent: Aug. 4, 2015

(54) EMBEDDED PACKAGE AND METHOD OF MANUFACTURING THE SAME

(71) Applicant: SK hynix Inc., Icheon-si Gyeonggi-do (KR)

(72) Inventors: Sang Yong Lee, Icheon-si (KR); Si Han Kim, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 11 days.

(21) Appl. No.: 13/846,807

(22) Filed: Mar. 18, 2013

(65) Prior Publication Data

US 2014/0167275 A1  Jun. 19, 2014

(30) Foreign Application Priority Data

Dec. 18, 2012  (KR) .......................... 10-2012-148894

(51) Int. Cl.
*H01L 23/31* (2006.01)
*H01L 23/498* (2006.01)
(Continued)

(52) U.S. Cl.
CPC ............ *H01L 24/03* (2013.01); *H01L 23/3128* (2013.01); *H01L 23/498* (2013.01); *H01L 23/49822* (2013.01); *H01L 23/49827* (2013.01); *H01L 23/49833* (2013.01); *H01L 23/5389* (2013.01); *H01L 24/19* (2013.01); *H01L 24/20* (2013.01); *H01L 24/24* (2013.01); *H01L 24/82* (2013.01); *H01L 24/92* (2013.01); *H05K 1/185* (2013.01); *H01L 24/13* (2013.01); *H01L 24/29* (2013.01); *H01L 24/32* (2013.01); *H01L 24/83* (2013.01); *H01L 2224/12105* (2013.01); *H01L 2224/131* (2013.01); *H01L 2224/2101* (2013.01); *H01L 2224/214* (2013.01); *H01L 2224/24011* (2013.01); *H01L 2224/24051* (2013.01); *H01L 2224/24226* (2013.01); *H01L 2224/24227* (2013.01); *H01L 2224/2919* (2013.01); *H01L 2224/32225* (2013.01); *H01L 2224/73267* (2013.01); *H01L 2224/82101* (2013.01); *H01L 2224/82102* (2013.01); *H01L 2224/82104* (2013.01); *H01L 2224/82106* (2013.01); *H01L 2224/8385* (2013.01); *H01L 2224/92* (2013.01); *H01L 2224/92132* (2013.01); *H01L 2224/92244* (2013.01); *H05K 3/12* (2013.01); *H05K 3/18* (2013.01); *H05K 3/4644* (2013.01)

(58) Field of Classification Search
CPC ........... H01L 2224/48105; H01L 2224/16227; H01L 23/3128; H01L 23/498; H01L 23/49822; H01L 23/49827; H01L 23/49833
USPC ......................................................... 257/700
See application file for complete search history.

(56) References Cited

U.S. PATENT DOCUMENTS 7,989,706 B2     8/2011  Shizuno
2006/0145331 A1*  7/2006  Cho et al. ...................... 257/700
(Continued)

FOREIGN PATENT DOCUMENTS

| KR | 1020000043575 A | 7/2000 |
| KR | 1020070006327 A | 1/2007 |
| KR | 1020100020763 A | 2/2010 |

*Primary Examiner* — Phat X Cao
(74) *Attorney, Agent, or Firm* — William Park & Associates

(57) ABSTRACT

An embedded package in which active elements, such as semiconductor chips, are embedded within a package substrate. The semiconductor chips, embedded within a dielectric layer, are coupled with circuit wires to ensure electrical and signal continuity. When connections between the semiconductor chip and the package substrate are performed in different directions, there is a reduction in overall interconnection area, connection reliability is improved, leakage currents are reduced, and higher device yields can be realized.

6 Claims, 10 Drawing Sheets

(51) Int. Cl.
*H01L 23/00* (2006.01)
*H01L 23/538* (2006.01)
*H05K 1/18* (2006.01)
*H05K 3/12* (2006.01)
*H05K 3/18* (2006.01)
*H05K 3/46* (2006.01)

(56) References Cited

U.S. PATENT DOCUMENTS

2008/0111230 A1* 5/2008 Kim et al. .................... 257/700
2010/0295170 A1* 11/2010 Komura et al. ............... 257/700

* cited by examiner (a)

(b)

EMBEDDED PACKAGE AND METHOD OF MANUFACTURING THE SAME

CROSS-REFERENCE TO RELATED APPLICATION

The present application claims priority under 35 U.S.C. 119(a) to Korean Application No. 10-2012-148894, filed on Dec. 18, 2012, in the Korean Intellectual Property Office, which is incorporated herein by reference in its entirety as though fully set forth herein.

BACKGROUND

The present invention relates generally to semiconductor package technology, and in particular to an embedded package and a method of manufacturing the same.

Electronic circuit elements for an electronic device can include a variety of active and passive circuit elements. The electronic circuit elements can be integrated into a semiconductor chip or a semiconductor substrate (also called a die). The electronic elements of an integrated circuit can be provided in the form of an electronic package mounted on a package substrate, including circuit wires, like a Printed Circuit Board (PCB). The electronic package can be mounted on the main board of an electronic device and can be used to form an electronic system, such as a computer, a mobile device, or a data storage system.

In an effort to reduce the thickness of a semiconductor package, attempts have been made to implement an embedded package in which active elements, such as semiconductor chips, are embedded within a package substrate. In order to implement the embedded package, it is necessary to couple the semiconductor chips, embedded within a dielectric layer, with circuit wires to ensure electrical and signal continuity. Consequently, improving the reliability of the interconnections between the semiconductor chips and the circuit wires has become an important issue.

Furthermore, electronic package size continues to be reduced even though higher performance and greater operating speed continue to be required. In addition, the number of inputs and outputs of a semiconductor chip continues to be increased, but the size of the semiconductor chip continues to be reduced.

SUMMARY

In an embodiment in accordance with the present invention, a package substrate having circuit wire patterns disposed thereon, a semiconductor chip formed over the package substrate, dielectric layers having metal patterns formed thereon, the dielectric layers configured to cover the semiconductor chip, and first and second connection wire patterns, wherein the first connection wire pattern electrically connects the circuit wire patterns on the package substrate and the semiconductor chip, while the second wire pattern electrically connects the metal patterns and the semiconductor chip.

The package substrate further comprises a core having circuit wire patterns formed on outer surfaces of the core.

The dielectric layers include open regions through which parts of the circuit wire patterns are exposed.

The first connection wire pattern is horizontally connected to the semiconductor chip, and the second connection wire pattern is vertically connected to the semiconductor chip.

The first connection wire pattern is extended along an outer surface of the semiconductor chip and coupled with the circuit wire pattern.

In another embodiment, an embedded package comprises a package substrate configured to include a core having circuit wire patterns formed on the outer surfaces of the core, a semiconductor chip formed over a package substrate and configured to include a first bonding pad and a second bonding pad, dielectric layers configured to fill the semiconductor chip and the package substrate and to have open regions formed in the dielectric layers through which parts of the circuit wire patterns are exposed, metal wire patterns formed over the dielectric layers, a first connection wire pattern coupled with the first bonding pad and coupled with the circuit wire pattern formed on the core in a first direction, and a second connection wire pattern coupled with the second bonding pad and coupled with the metal wire pattern formed on the dielectric layer in a second direction different from the first direction.

The package substrate further includes a cavity in which the semiconductor chip is disposed.

The first connection wire pattern is coupled with the first bonding pad and extended along an outer surface of the semiconductor chip.

In yet another embodiment, a method of manufacturing an embedded package includes disposing a semiconductor chip, including a first bonding pad and a second bonding pad, over a package substrate configured to include a core having circuit wire patterns formed on the outer surfaces of the core, forming a first connection wire pattern configured to couple together a circuit wire pattern formed on the same layer with the semiconductor chip and the first bonding pad, and forming a second connection wire pattern configured to couple together a metal wire pattern formed on a different layer from the semiconductor chip and the second bonding pad.

Disposing the semiconductor chip over the package substrate includes adhering the semiconductor chip over the core with an adhesion layer interposed between the semiconductor chip and the core.

Disposing the semiconductor chip over the package substrate includes forming a cavity in which the semiconductor chip will be disposed in a through-hole formed by performing laser drilling or mechanical drilling on the package substrate and disposing the semiconductor chip within the cavity.

The first connection wire pattern is horizontally coupled with the first bonding pad, extended along an outer surface of the semiconductor chip, and coupled with the circuit wire pattern, and the second connection wire pattern is vertically coupled with the second bonding pad.

BRIEF DESCRIPTION OF THE DRAWINGS

The above and other aspects, features and advantages will be more clearly understood from the following detailed description taken in conjunction with the accompanying drawings, in which.

DETAILED DESCRIPTION

Although the present invention is described with reference to a number of example embodiments thereof, it should be understood that numerous other modifications and variations can be devised by those skilled in the art that will fall within the spirit and scope of the invention.

It is difficult under any circumstances to embed a small-sized semiconductor chip within an embedded package. Modern semiconductor fabrication technologies are currently addressing reduction in device power consumption as well as higher performance standards. These competing interests, coupled with a desire to improve electrical characteristics by reducing the length of electrical connections between the semiconductor chips and the package substrate, render the task of manufacturing an embedded package very difficult using current techniques.

Figure 1:
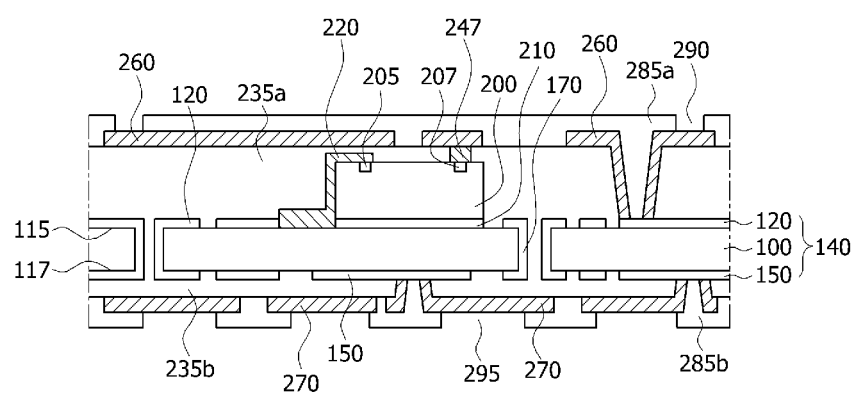
FIG. 1 is a diagram illustrating an embedded package in accordance with the present invention.

Referring to FIG. 1, the embedded package in an embodiment includes a package substrate 140 configured to include a core 100 having first and second circuit wire patterns 120 and 150 formed on outer surfaces of the core 100, a semiconductor chip 200 configured to include a first bonding pad 205 and a second bonding pad 207 formed over the package substrate 140, a first connection wire pattern 220 electrically connected to the first bonding pad 205, and a second connection wire pattern 247 electrically connected to the second bonding pad 207. The first connection wire pattern 220 is horizontally coupled with the first bonding pad 205 and extended along a shape of an outer surface of the semiconductor chip 200. The second connection wire pattern 247 is vertically coupled with the second bonding pad 207. Furthermore, the semiconductor chip 200 is attached over the core 100 of the package substrate 140 with an adhesion layer 210 interposed between the semiconductor chip 200 and the core 100. Furthermore, the semiconductor chip 200 is embedded within the package substrate 140 by using a dielectric layer 235a formed on a first face 115 of the core 100. Open regions 290 and 295 are defined on both sides of the respective dielectric layers 235a and 235b by parts of first connection patterns 260 and second connection patterns 270 exposed through a solder resist layer 285a.

In the embedded package in an embodiment, the first connection wire pattern 220 disposed as described above is coupled with the first bonding pad 205 and also coupled with the first circuit wire pattern 120 horizontally formed in the first face 115 of the core 100, thus transferring an electrical signal in a first direction, that is, in a horizontal direction. In contrast, the second connection wire pattern 247 is vertically coupled with the second bonding pad 207, thus transferring an electrical signal in a second direction different from the first direction; that is, in a vertical direction, in contrast with the horizontal direction along which the first connection wire pattern 220 transfers the electrical signal.

A method of manufacturing the embedded package in an embodiment in accordance with the present invention is described below with reference to FIGS. 2 to 9.

Figure 2:
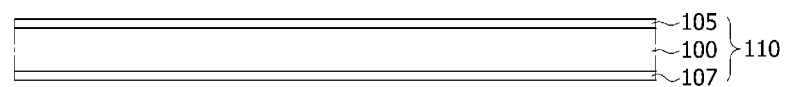
FIGS. 2 to 9 are diagrams illustrating a method of manufacturing the embedded package in accordance with the present invention.

Referring to FIG. 2, a Copper Clad Laminate (CCL) 110 is prepared. The CCL 110 has a structure in which thin copper layers 105 and 107 are adhered to both sides of the core 100. The core 100 can be formed of a dielectric layer or can be made of prepreg (reinforcement material pre-impregnated with a polymer or resin matrix). In some embodiments, the core 100 can be formed of a dielectric layer including multi-layered wires (not shown) and connection vias (not shown). The thin copper layers 105 and 107 adhered to both sides of the core 100 are introduced in order to form circuit wires or substrate connection terminals for connection. These may include, but are not limited to, copper wire patterns for wire lands or ball lands on a surface of a PCB in a subsequent process.

Figure 3:
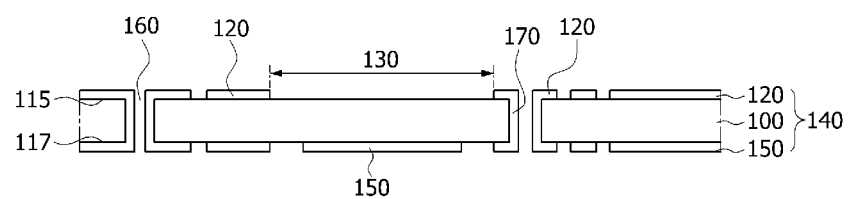

Referring to FIG. 3, via holes 160 configured to penetrate the core 100 of the CCL 110 are formed, and the first and the second circuit wire patterns 120 and 150 are formed on the outer surfaces of the core 100, thus forming the package substrate 140 to be used in an embodiment in accordance with the present invention. Each of the via holes 160 penetrating the core 100 can be formed as a through-hole by performing laser drilling or mechanical drilling on the package substrate. In order to form the first and the second circuit wire patterns 120 and 150 on the outer surfaces of the core 100, the first circuit wire pattern 120 is formed in the first face 115 by forming a plating resist in accordance with a Semi-Additive Plating (SAP) or Modified Semi-Additive Plating (MSAP) method, and performing a copper plating process on the plating resist. The second circuit wire pattern 150 is formed in the second face 117. Next, a third circuit wire pattern 170 configured to cover wall surfaces of the via holes 160 is formed in order to electrically couple the second circuit wire pattern 150 with the first circuit wire pattern 120. This process can be performed in accordance with a well-known process of fabricating a PCB. In the first face 115, a surface of the core 100, in a region 130 where the semiconductor chip 200 for forming the embedded package will be disposed, can be exposed.

Figure 4:
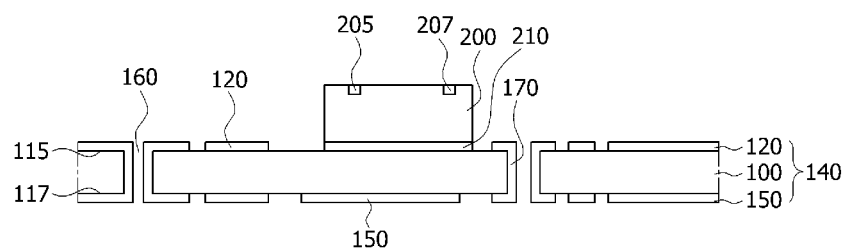

Referring to FIG. 4, the semiconductor chip 200 is attached to the first face 115 of the core 100. The semiconductor chip 200 is configured to include the first bonding pad 205 and the second bonding pad 207 spaced apart from the first bonding pad 205 at a specific interval. The semiconductor chip 200 can be attached to the first face 115 of the core 100 by using the adhesion layer 210.

Figure 5:
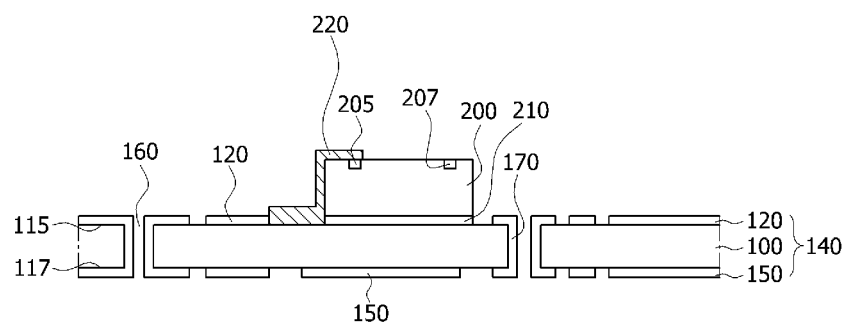

Referring to FIG. 5, the first connection wire pattern 220, electrically connected to the first bonding pad 205 of the semiconductor chip 200, is formed. The first connection wire pattern 220 can be configured to be horizontally coupled with the first bonding pad 205 of the semiconductor chip 200. The first connection wire pattern 220 can be configured to be horizontally coupled with the first bonding pad 205, vertically extended along the outer surface of the semiconductor chip 200, and coupled with the first circuit wire pattern 120. Here, the first connection wire pattern 220 can be formed by a selective plating method using wire bonding technology or a lithography method. In some embodiments, the first connection wire pattern 220 may be formed by a conductor printing method using a mask or jetting technology.

Figure 6:
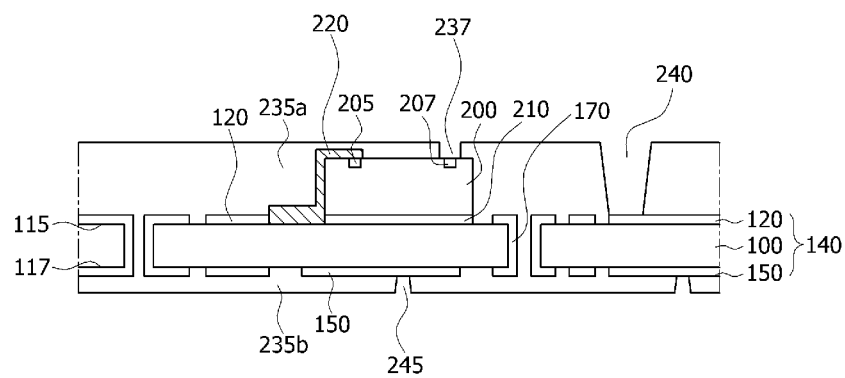

Referring to FIG. 6, the dielectric layers 235a and 235b in which the semiconductor chip 200 is embedded are formed. To this end, the semiconductor chip 200 is embedded in the dielectric layers 235a and 235b by laminating the dielectric layers 235a and 235b on the package substrate 140 to which the semiconductor chip 200 is attached by way of pressurization and heating. The dielectric layers 235a and 235b can be formed to include an Aginomoto Build-up Film (ABF). As a result of the lamination, a dielectric material or a resin component that forms the dielectric layers 235a and 235b covers the exposed surfaces of the semiconductor chip 200.

Next, a contact hole 237 through which a surface of the second bonding pad 207 of the semiconductor chip 200 is exposed is formed by selectively etching the dielectric layers 235a and 235b. The contact hole 237 defines a region where the second connection wire pattern 247 to be formed in a subsequent process will be formed. The contact hole 237 can be formed in the dielectric layer 235a by performing a laser drilling or dry etch process. A first through-hole 240 through which part of the first circuit wire pattern 120 is exposed can be formed by etching the dielectric layer 235a of the first face 115 while etching the contact hole 237. At the same time, a second through-hole 245 through which part of the second circuit wire pattern 150 is exposed can be formed by etching the dielectric layer 235b of the second face 117.

Figure 7:
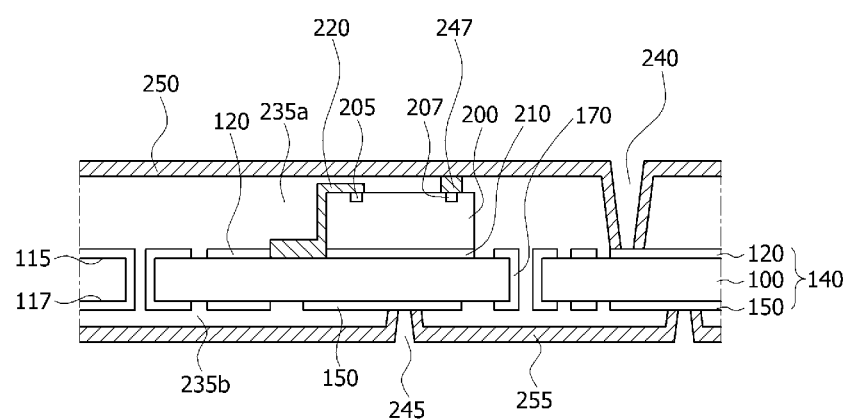

Referring to FIG. 7, the second connection wire pattern 247 electrically connected to the second bonding pad 207 is formed on the dielectric layer 235a of the first face 115 by filling the contact hole 237 with a metal material. The second connection wire pattern 247 can be formed to include copper. The second connection wire pattern 247 can be configured to be vertically coupled with the second bonding pad 207 of the semiconductor chip 200. Next, a first metal layer 250 extended along a surface of the first through-hole 240 and electrically connected to the first circuit wire pattern 120 is formed on the dielectric layer 235a of the first face 115. A second metal layer 255 extended along a surface of the second through-hole 245 and electrically connected to the second circuit wire pattern 150 is formed on the dielectric layer 235b of the second face 117.

In an embodiment in accordance with the present invention, the method of forming the second connection wire pattern 247 by filling the contact hole 237 formed by etching the dielectric layers 235a and 235b with a metal material has been described as an example, but the present invention is not limited thereto. For example, prior to the formation of the dielectric layers 235a and 235b, a metal bump may be first formed on the second bonding pad 207 of the semiconductor chip 200 and the dielectric layers 235a and 235b may be formed subsequently.

Figure 8:
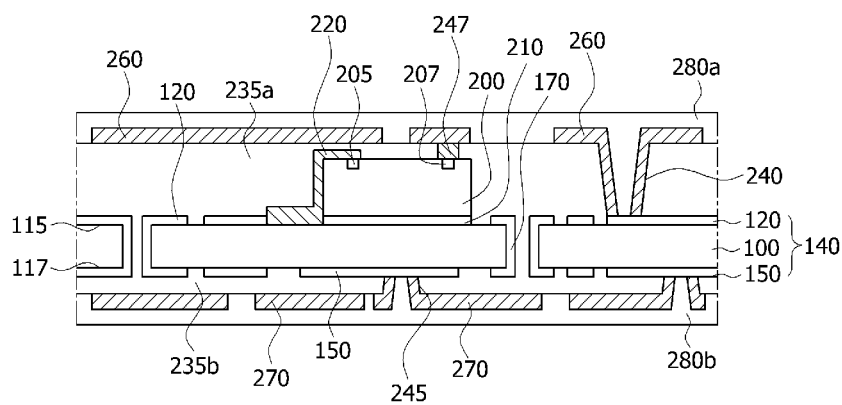

Referring to FIG. 8, first metal patterns 260 can be formed by patterning the first metal layer 250 so that parts of a surface of the dielectric layer 235a of the first face 115 are exposed, and second metal patterns 270 can be formed by patterning the second metal layer 255 so that part of a surface of the dielectric layer 235b of the second face 117 is exposed. The first metal pattern 260 is extended along a wall surface of the first through-hole 240 and electrically connected to the first circuit wire pattern 120, and the second metal pattern 270 is extended along a wall surface of the second through-hole 245 and electrically connected to the second circuit wire pattern 150. The first metal layer 250 and the second metal layer 255 can be patterned in accordance with a lithography method.

Next, a solder resist layer 280a is formed so that it covers the exposed portion of the dielectric layer 235a on the first face 115 and the first metal pattern 260, and at the same time, a solder resist layer 280b is formed so that it covers the exposed portion of the dielectric layer 235b on the second face 117 and the second metal pattern 270.

Figure 9:
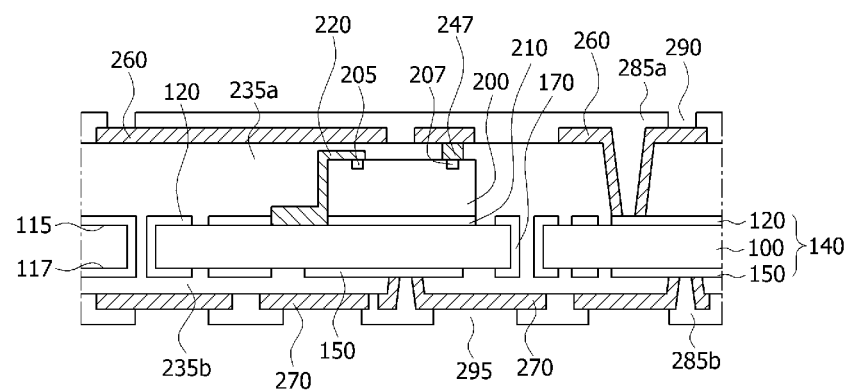

Referring to FIG. 9, solder resist patterns 285a and 285b, including the open regions 290 and 295 through which parts of the first metal pattern 260 and the second metal pattern 270 are exposed, are formed by patterning the solder resist layers 280a and 280b. The open regions 290 and 295 function as ball lands to which external connection terminals, for example, solder balls, are attached.

In the embedded package in an embodiment in accordance with the present invention, the first connection wire pattern 220 disposed as described above is coupled with the first bonding pad 205 and also coupled with the first circuit wire pattern 120 horizontally formed in the first face 115 of the core 100, thus transferring an electrical signal in a first direction, that is, in a horizontal direction. In contrast, the second connection wire pattern 247 is vertically coupled with the second bonding pad 207, thus transferring an electrical signal in a second direction different from the first direction; that is, in a vertical direction, in contrast with the horizontal direction along which the first connection wire pattern 220 transfers the electrical signal.

Figure 10:
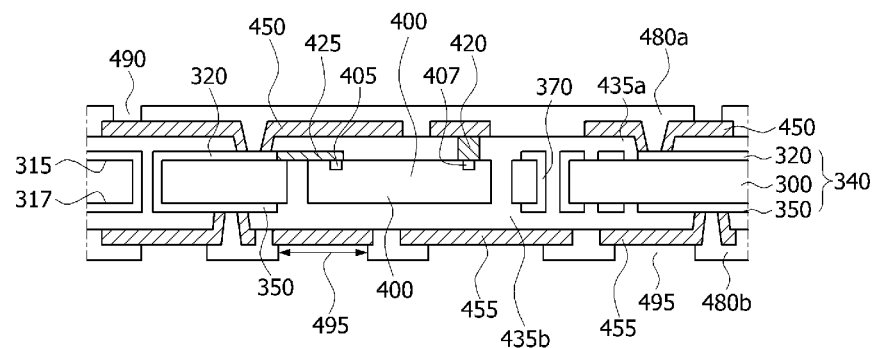
FIG. 10 is a diagram illustrating an embedded package in accordance with the present invention.

FIG. 10 is a diagram illustrating an embedded package in another embodiment in accordance with the present invention.

The embedded package in another embodiment includes a package substrate 340 configured to include a core 300 having first and second circuit wire patterns 320 and 350 formed on outer surfaces of the core, a semiconductor chip 400 disposed within the package substrate 340 and configured to include a first bonding pad 405 and a second bonding pad 407, a second connection wire pattern 425 electrically connected to the first bonding pad 405, and a first connection wire pattern 420 electrically connected to the second bonding pad 407. The first connection wire pattern 420 is vertically coupled with the second bonding pad 407. The second connection wire pattern 425 is configured to be horizontally coupled with the first bonding pad 405 and coupled with the first circuit wire pattern 320 formed on a first face 315 of the core 300. The semiconductor chip 400 is embedded within the package substrate 340 by using dielectric layers 435a and 435b. Open regions 490 and 495 are defined on both sides of the dielectric layers 435a and 435b by first metal patterns 450 exposed through solder resist patterns 480a and 480b and part of second metal patterns 455.

A method of manufacturing the embedded package in accordance with another embodiment is described below with reference to FIGS. 11 to 17.

Figure 11:
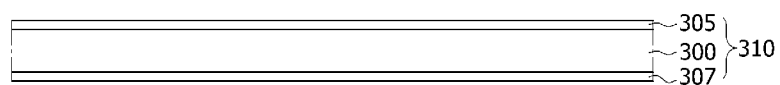
FIGS. 11 to 18 are diagrams illustrating a method of manufacturing the embedded package in another embodiment in accordance with the present invention.

Referring to FIG. 11, a Copper Clad Laminate (CCL) 310 is prepared. The CCL 310 has a structure in which thin copper layers 305 and 307 are adhered to both sides of the core 300. The core 300 can be formed of a dielectric layer or can be made of prepreg. In some embodiments, the core 300 can be formed of a dielectric layer including multi-layered wires (not shown) and connection vias (not shown). Here, the thin copper layers 305 and 307 adhered to both sides of the core 300 are introduced in order to form circuit wires or substrate connection terminals for connection. These may include, but are not limited to, copper wire patterns for wire lands or ball lands on a surface of a PCB in a subsequent process.

Figure 12:
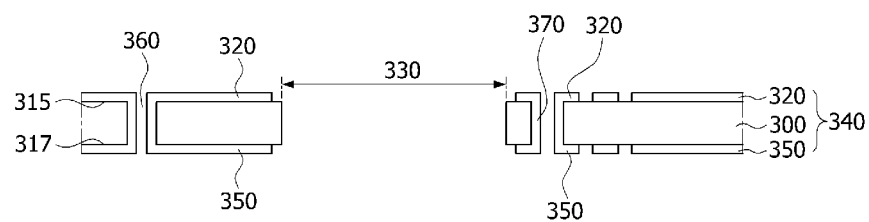

Referring to FIG. 12, via holes 360 penetrating the core 300 of the CCL 310 are formed and the first and the second circuit wire patterns 320 and 350 are formed on the outer surfaces of the core 300, thereby forming the package substrate 340 to be used in the present embodiment. Each of the via holes 360 configured to penetrate the core 300 can be formed as a through-hole by performing laser drilling or mechanical drilling on the package substrate 340. In order to form the first and the second circuit wire patterns 320 and 350 on the outer surfaces of the core 300, the first circuit wire pattern 320 is formed on the first face 315 and the second circuit wire pattern 350 is formed on a second face 317 by forming a plating resist in accordance with a Semi-Additive Plating (SAP) or Modified Semi-Additive Plating (MSAP) method and performing a copper plating process. A third circuit wire pattern 370 configured to cover wall surfaces of the via holes 360 is formed so that the second circuit wire pattern 350 and the first circuit wire pattern 320 are electrically coupled together. This process can be performed in accordance with a well-known process of manufacturing a PCB. Here, a cavity 330 can be formed in a region in which the semiconductor chip 400 for forming the embedded package will be disposed within the package substrate 340.

Figure 13:
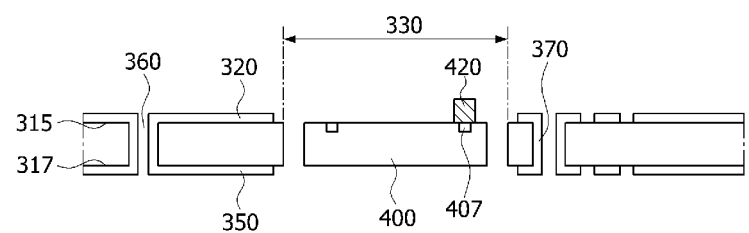

Referring to FIG. 13, the semiconductor chip 400 is disposed within the cavity 330 of the core 300. The semiconductor chip 400 is configured to include the first bonding pad 405 and the second bonding pad 407 spaced apart from the first bonding pad 405 at a specific interval. The semiconductor chip 400 can further include the first connection wire pattern 420 vertically coupled with the second bonding pad 407 and formed of a metal bump.

Figure 14:
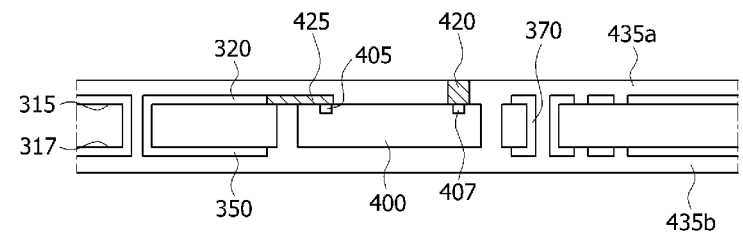

Referring to FIG. 14, the second connection wire pattern 425 electrically connected to the first bonding pad 405 of the semiconductor chip 400 is formed. The second connection wire pattern 425 can be configured to be horizontally coupled with the first bonding pad 405 of the semiconductor chip 400. The second connection wire pattern 425 can be configured to be horizontally coupled with the first bonding pad 405, extended in the direction of the outside of the semiconductor chip 400, and coupled with the first circuit wire pattern 320. The second connection wire pattern 425 can be formed by a selective plating method using wire bonding technology or a lithography method. In some embodiments, the second connection wire pattern 425 may be formed by a conductor printing method using a mask or jetting technology.

Figure 15:
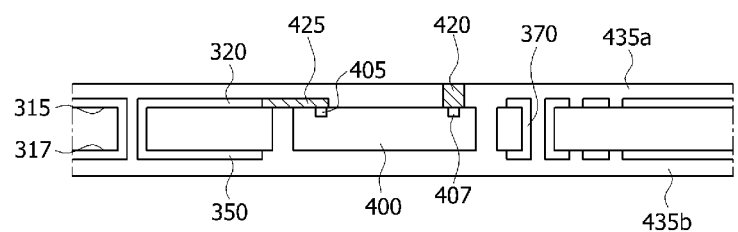

Referring to FIG. 15, the dielectric layers 435a and 435b in which the semiconductor chip 400 is embedded are formed. To this end, the dielectric layers 435a and 435b are disposed on the package substrate 340 to which the semiconductor chip 400 has been adhered, and the semiconductor chip 400 is embedded within the dielectric layers 435a and 435b by performing lamination using pressurization and heating. As a result of the lamination, the exposed surfaces of the semiconductor chip 400 and the first connection wire pattern 420 are covered with materials forming the dielectric layers 435a and 435b, but a top surface of the second connection wire pattern 425 is not covered with the materials forming the dielectric layers 435a and 435b.

Figure 16:
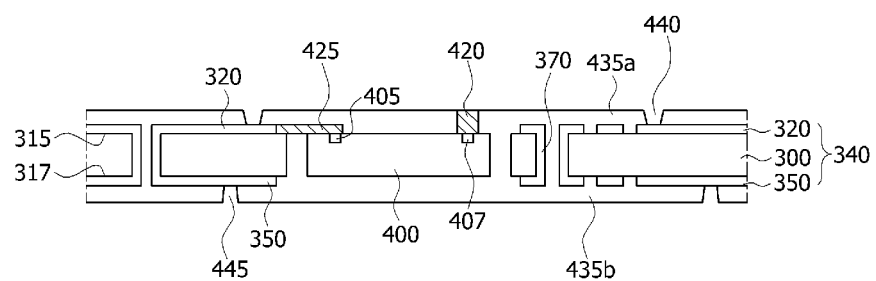

Referring to FIG. 16, first through-holes 440 and second through-holes 445 are formed by selectively etching the dielectric layers 435a and 435b. The through-holes 440 and 445 can be formed in the dielectric layers 435a and 435b by performing laser drilling or a dry etch process. The first through-hole 440 can be formed to have the first circuit wire pattern 320 on the first face 315 exposed therethrough, and the second through-hole 445 can be formed to have the second circuit wire pattern 350 on the second face 317 partially exposed therethrough.

Figure 17:
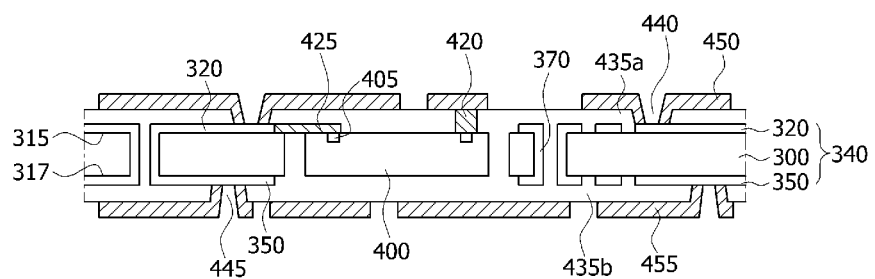

Referring to FIG. 17, the first metal patterns 450 are formed on the dielectric layer 435a on the first face 315, and the second metal patterns 455 are formed on the dielectric layer 435b on the second face 317. The first metal pattern 450 is extended along a wall surface of the first through-hole 440 and electrically connected to the first circuit wire pattern 320, and the second metal pattern 455 is extended along a wall surface of the second through-hole 445 and electrically connected to the second circuit wire pattern 350. To this end, the first metal patterns 450 and the second metal patterns 455 are formed by forming a metal layer on the dielectric layers 435a and 435b on the first face 115 and the second face 117 and then patterning the metal layer.

Figure 18:
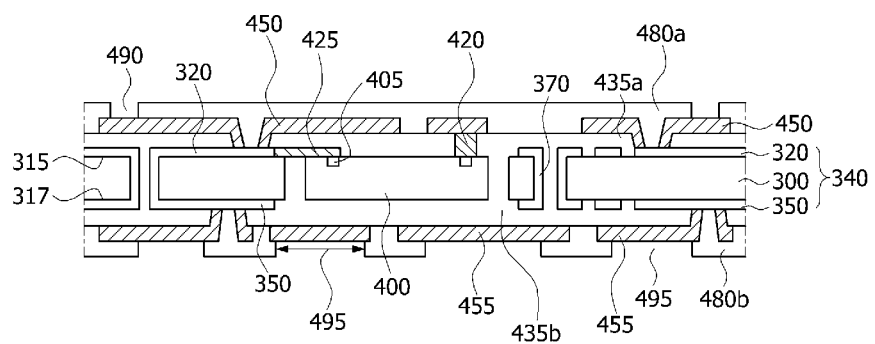

Referring to FIG. 18, the solder resist patterns 480a and 480b including the open regions 490 and 495 through which parts of the first metal patterns 450 and the second metal patterns 455 are exposed are formed. To this end, first, a solder resist layer is formed to cover all the exposed parts of the dielectric layers 435a and 435b, the first metal patterns 450, and the second metal patterns 455. The solder resist patterns 480a and 480b are formed by selectively removing the solder resist layer using a lithography process including exposure and development processes. Although not shown in a subsequent process, a mounting process of adhering external connection terminals, for example, solder balls to the open regions can be performed.

If the embedded package in accordance with an embodiment of the present invention is used, the density of the circuits of a package substrate coupled with a semiconductor chip can be increased by making different connections between the semiconductor chip and the circuit wires. Furthermore, electrical characteristics can be improved by shortening an electrical connection distance between the semiconductor chip and the package substrate.

Figure 19:
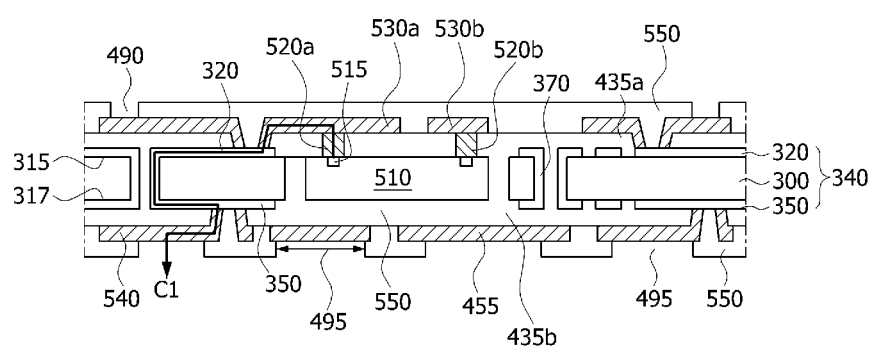
FIGS. 19(a)-19(b) is a diagram illustrating the length of a semiconductor package for electrical connection.
Figure 19:
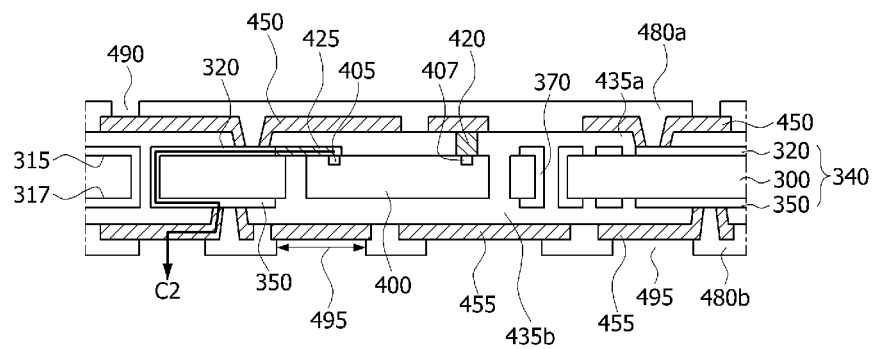

More particularly, FIG. 19 shows an electrical connection distance between the semiconductor chip and the package substrate. Referring to FIG. 19(a), if connection between a semiconductor chip 510 embedded in a core 500 and a first circuit wire 520a and connection between the semiconductor chip 510 and a second circuit wire 520b are performed in the same direction, an electrical signal flows in an arrow direction indicated by 'C1'. In this case, the length of the electrical signal is lengthened because the first circuit wire 520a coupled with a first bonding pad 515 is electrically connected to a first circuit wire pattern 320 through a first connection pattern 530a formed on a dielectric layer 550.

In contrast, referring to FIG. 19(b) showing the embedded package in an embodiment in accordance with the present invention, in the semiconductor chip 400 embedded in the core 300 and the first circuit wire pattern 320, an electrical signal flows in an arrow direction indicated by 'C2' because the second connection wire pattern 425, coupled with the first bonding pad 405, is configured to penetrate the cavity 330 and be coupled with the first circuit wire pattern 320 disposed in a horizontal direction. Accordingly, the length of the electrical signal path is shorter than that of FIG. 19(a) because the electrical signal flows without passing through the first connection pattern 450. If the electrical signal path is shortened, the electrical characteristics of a package device can be improved because the occurrence of a leakage current resulting from an increase in signal path length is reduced. Furthermore, connections between the semiconductor chip 400 and the package substrate are performed in different directions, that is, in a horizontal direction and in a vertical direction. Accordingly, the degree of integration of circuits at a connection portion can be reduced and thus a semiconductor package having a fine pitch can be implemented.

While certain embodiments have been described above, it will be understood by those skilled in the art that the embodiments described are by way of example only. Accordingly, the embedded package and method of manufacture described herein should not be limited based on the described embodiments. Rather, the embedded package and method of manufacture described herein should only be limited in light of the claims that follow, when taken in conjunction with the above description and accompanying drawings.

What is claimed is:
1. An embedded package, comprising:
 a package substrate having a core having a first circuit wire pattern and a second circuit wire pattern formed on outer surfaces of the core, wherein the first circuit wire pattern formed on a first surface of the core and the second circuit wire pattern formed on a second surface that opposes the first surface of the core;
 a semiconductor chip formed on the first surface of the core of the package substrate;
 first and second bonding pads formed on the semiconductor chip;
 a dielectric layer having a first metal pattern formed on one surface of the dielectric layer and, the dielectric layer configured to cover the semiconductor chip, wherein the dielectric layer comprise open regions through which parts of the first and the second circuit wire patterns are exposed;

a first connection wire pattern directly connects between the first bonding pad and the first circuit wire pattern of the core, wherein the first connection wire pattern contacts with the first bonding pad and vertically extends along the outer surface of the semiconductor chip to contact with the first circuit wire pattern; and a second connection wire pattern directly connects between the second bonding pad and the first metal pattern of the dielectric layer, wherein the second connection wire pattern vertically penetrates the dielectric layer.

2. An embedded package, comprising:

a package substrate configured to include a core a first having circuit wire pattern and a second circuit wire pattern formed on outer surfaces, wherein the first circuit wire pattern formed on a first surface of the core and the second circuit wire pattern formed on a second surface of the core, wherein the package substrate has a cavity;

a semiconductor chip located in the cavity of the package substrate, wherein a top surface of the semiconductor has same level with a top surface of the core of the package substrate;

a first bonding pad and a second bonding pad formed on the semiconductor chip;

a dielectric layer configured to cover the semiconductor chip and the package substrate and to have open regions formed in the dielectric layer through which parts of the first and the second circuit wire patterns are exposed;

a first metal wire pattern formed on one surface of the dielectric layer;

a first connection wire pattern directly connects between the first bonding pad and the first circuit wire pattern formed on the core in a horizontal direction, wherein the first connection wire pattern has same level with the first circuit wire pattern; and a second connection wire pattern directly connects between the second bonding pad and the first metal wire pattern formed on the dielectric layer, wherein the second connection wire pattern vertically penetrates the dielectric layer.

3. A method of manufacturing an embedded package, comprising:

providing a package substrate configured to include a core having a first circuit wire pattern and a second circuit wire pattern formed on outer surfaces of the core, wherein the first circuit wire pattern formed on a first surface of the core and the second circuit wire pattern formed on a second surface of the core;

disposing a semiconductor chip, including a first bonding pad and a second bonding pad, on the first surface of the core of the package substrate;

forming a first connection wire pattern configured to directly connect together the first circuit wire pattern formed on the same layer with the semiconductor chip and the first bonding pad, wherein the first connection wire pattern horizontally contacts with the first bonding pad and extends along an outer surface of the semiconductor chip and the first surface of the core;

forming a dielectric layer having a contact hole configured to cover the semiconductor chip and the package substrate while exposing the second bonding pad by the contact hole;

forming a second connection wire pattern by filling the contact hole, wherein the second connection wire pattern has same level with a top surface of the dielectric layer; and forming a first metal wire pattern on the dielectric layer to directly connect with the second connection wire pattern.

4. The method of claim 3, wherein the step of disposing the semiconductor chip on the first surface of the core of the package substrate further comprises the step of:

adhering the semiconductor chip over the core with an adhesion layer interposed between the semiconductor chip and the core.

5. The method of claim 3, wherein the first connection wire pattern is formed by an operation selected from the group of operations consisting of:

a wire bonding, a plating method, and a conductor printing method using jetting technology.

6. The method of claim 3, wherein the dielectric layer is formed by lamination using pressurization and heating.

* * * * *